United States Patent
Zhang

(10) Patent No.: US 11,233,154 B2
(45) Date of Patent: Jan. 25, 2022

(54) THIN FILM TRANSISTOR AND MANUFACTURING METHOD THEREOF, ARRAY SUBSTRATE, AND DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventor: Di Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 381 days.

(21) Appl. No.: 16/470,412

(22) PCT Filed: Dec. 21, 2018

(86) PCT No.: PCT/CN2018/122546
§ 371 (c)(1),
(2) Date: Jun. 17, 2019

(87) PCT Pub. No.: WO2019/134535
PCT Pub. Date: Jul. 11, 2019

(65) Prior Publication Data
US 2021/0328060 A1    Oct. 21, 2021

(30) Foreign Application Priority Data
Jan. 5, 2018    (CN) .......................... 201810011442.4

(51) Int. Cl.
*H01L 21/786*    (2006.01)
*H01L 29/786*    (2006.01)
(Continued)

(52) U.S. Cl.
CPC .... *H01L 29/7869* (2013.01); *H01L 21/02565* (2013.01); *H01L 21/465* (2013.01);
(Continued)

(58) Field of Classification Search
CPC ......... H01L 21/02521; H01L 21/02565; H01L 21/0259; H01L 21/02601; H01L 21/02656;
(Continued)

(56) References Cited

U.S. PATENT DOCUMENTS

2010/0135854 A1    6/2010 Yang et al.
2011/0133176 A1    6/2011 Lee et al.
(Continued)

FOREIGN PATENT DOCUMENTS

CN    101013740 A    8/2007
CN    101248219 A    8/2008
(Continued)

OTHER PUBLICATIONS

Office action dated May 19, 2020 for application No. CN201810011442.4 with English Translation attached.
(Continued)

*Primary Examiner* — Cheung Lee
(74) *Attorney, Agent, or Firm* — Nath, Goldberg & Meyer; Joshua B. Goldberg

(57) ABSTRACT

A thin film transistor, a manufacturing method thereof, an array substrate, and a display panel are provided. The thin film transistor includes a semiconductor layer, a source and a drain. The semiconductor layer includes an active layer and a superhydrophobic layer. The active layer includes a source contact, a drain contact and a channel portion. The source corresponds to the source contact, and the drain corresponds to the drain contact. The superhydrophobic layer is disposed on a surface of the active layer proximal to
(Continued)

the source and the drain. The superhydrophobic layer includes a plurality of multi-level nanostructures protruding from the surface of the active layer, and the superhydrophobic layer at least covers a channel portion of the active layer.

20 Claims, 3 Drawing Sheets

(51) Int. Cl.
 H01L 27/12 (2006.01)
 H01L 29/24 (2006.01)
 H01L 29/66 (2006.01)
 H01L 21/02 (2006.01)
 H01L 21/465 (2006.01)
 H01L 21/4763 (2006.01)

(52) U.S. Cl.
 CPC ...... *H01L 21/47635* (2013.01); *H01L 27/127* (2013.01); *H01L 27/1225* (2013.01); *H01L 27/1288* (2013.01); *H01L 29/24* (2013.01); *H01L 29/66969* (2013.01); *H01L 29/78696* (2013.01)

(58) Field of Classification Search
 CPC ............ H01L 21/02664; H01L 21/465; H01L 21/4763; H01L 21/47635; H01L 21/823412; H01L 27/1214; H01L 27/1222; H01L 27/1259; H01L 27/127; H01L 27/1288; H01L 29/24; H01L 29/401; H01L 29/66007; H01L 29/66969; H01L 29/772; H01L 29/78; H01L 29/786; H01L 29/7869; H01L 29/78696
 See application file for complete search history.

(56) References Cited

U.S. PATENT DOCUMENTS

| 2013/0221346 A1 | 8/2013 | Lu et al. |
| 2014/0151694 A1 | 6/2014 | Shieh et al. |
| 2018/0151824 A1* | 5/2018 | Park .................... H01L 51/5004 |

FOREIGN PATENT DOCUMENTS

| CN | 101872097 A | 10/2010 |
| CN | 102427083 A | 4/2012 |
| CN | 103904127 A | 7/2014 |
| CN | 104934330 A | 9/2015 |

OTHER PUBLICATIONS

International Search Report dated Mar. 22, 2019 corresponding to application No. PCT/CN2018/122546.
Supplementary European Search Report dated Sep. 14, 2021 for application No. EP18887199.0.
Michael, et al., "Hierarchical roughness makes superhydrophobic states stable", Microelectronic Engineering, Amsterdam, NL, Feb. 15, 2007, vol. 84, No. 3.

* cited by examiner

THIN FILM TRANSISTOR AND MANUFACTURING METHOD THEREOF, ARRAY SUBSTRATE, AND DISPLAY PANEL

CROSS-REFERENCE TO RELATED APPLICATIONS

This is a National Phase Application filed under 35 U.S.C. 371 as a national stage of PCT/CN2018/122546, filed Dec. 21, 2018, an application claiming the benefit of Chinese Patent Application No. 201810011442.4, filed on Jan. 5, 2018, the contents of each of which are incorporated herein by reference in their entirety.

TECHNICAL FIELD

The disclosure relates to the field of display technology, in particular, to a thin film transistor, a manufacturing method thereof, an array substrate including the thin film transistor, and a display panel including the array substrate.

BACKGROUND

Thin film transistors are used in both a pixel circuit and a driving circuit of a display panel. The thin film transistors are classified into two types of transistors including a polysilicon thin film transistor and an oxide thin film transistor, depending on a material of an active layer of the thin film transistor.

SUMMARY

According to an aspect of the present disclosure, a thin film transistor is provided. The thin film transistor includes: an active layer; a superhydrophobic layer on the active layer; and a source and a drain on the superhydrophobic layer. The superhydrophobic layer is disposed on a surface of the active layer proximal to the source and the drain, the superhydrophobic layer includes a plurality of multi-level nanostructures protruding from the surface of the active layer, and the superhydrophobic layer covers at least a channel portion of the active layer.

In an embodiment, a first portion of the superhydrophobic layer in contact with the source serves as an ohmic contact portion of the source, a second portion of the superhydrophobic layer in contact with the drain serves as an ohmic contact portion of the drain, and a third portion of the superhydrophobic layer that is not in contact with the source and the drain serves as an etch barrier layer.

In an embodiment, the active layer further includes a source contact and a drain contact. The first portion of the superhydrophobic layer is between the source contact and the source. The second portion of the superhydrophobic layer is between the drain contact and the drain.

In an embodiment, the superhydrophobic layer has the same material as that of the active layer, the superhydrophobic layer covers the active layer, and the superhydrophobic layer has an edge aligned with an edge of the active layer.

In an embodiment, the superhydrophobic layer has a material different from that of the active layer.

In an embodiment, each of the plurality of multi-level nanostructures includes a main protrusion having a size of an order of nanometers, and at least one sub-protrusion formed on the main protrusion and having a size of an order of nanometer, and a distance between two adjacent main protrusions is in a range of 3 nm to 100 nm.

In an embodiment, the active layer has a material of metal oxide, for example, indium gallium zinc oxide.

According to an aspect of the present disclosure, an array substrate including the thin film transistor described above is provided.

According to an aspect of the present disclosure, a display panel including the array substrate described above is provided.

According to an aspect of the present disclosure, a method for manufacturing a thin film transistor is provided. The method includes: forming an active layer; forming a superhydrophobic layer on the active layer; forming a conductive layer covering the superhydrophobic layer, the conductive layer being attached onto the superhydrophobic layer; forming a mask pattern on the conductive layer; etching the conductive layer by performing a wet etching process with the mask pattern as an etch mask to obtain a pattern comprising a source and a drain. The superhydrophobic layer is disposed on a surface of the active layer proximal to the source and the drain, the superhydrophobic layer includes a plurality of multi-level nanostructures protruding from the surface of the active layer, and the superhydrophobic layer is disposed to cover at least a channel portion of the active layer.

In an embodiment, a first portion of the superhydrophobic layer in contact with the source serves as an ohmic contact portion of the source, a second portion of the superhydrophobic layer in contact with the drain serves as an ohmic contact portion of the drain. A third portion of the superhydrophobic layer that is not in contact with the source and the drain serves as an etch barrier layer.

In an embodiment, the method further includes: forming a source contact in the active layer below the first portion of the superhydrophobic layer, and forming a drain contact in the active layer below the second portion of the superhydrophobic layer.

In an embodiment, the forming a superhydrophobic layer on the active layer comprises: performing a surface treatment on the active layer by a nanoimprinting process, an anodized aluminum transfer process, a plasma etching process, or a pulse laser process to obtain the superhydrophobic layer.

In an embodiment, the forming a superhydrophobic layer on the active layer includes: forming an active layer; forming a semiconductor layer on the active layer; performing a surface treatment on the active layer by a nanoimprinting process, an anodized aluminum transfer process, a plasma etching process, or a pulse laser process to obtain the superhydrophobic layer. The active layer is made of a different material from that of the semiconductor layer.

In an embodiment, the performing a surface treatment on the active layer includes: introducing a process gas into a process chamber in which the active layer is deposited, and performing a plasma etching process on the active layer in the process chamber. The process gas includes oxygen and/or fluorinated carbon, and a power of the process chamber is in a range of 2500 W to 3500 W, and a duration of the plasma etching process is in a range of 180 s to 300 s.

In an embodiment, the performing a surface treatment on the active layer includes: performing the surface treatment on the active layer using pulse laser with a duration of 180 s to 300 s.

In an embodiment, etching the conductive layer by performing a wet etching process with the mask pattern as an etch mask to obtain a pattern comprising a source and a drain includes: supplying an etchant to the conductive layer by submerging, into the etchant, the conductive layer on which the mask pattern is formed; or supplying an etchant to the conductive layer by spraying the etchant over the conductive layer.

In an embodiment, before the forming an active layer, the method further includes: forming a pattern including a gate; and forming a gate insulating layer.

BRIEF DESCRIPTION OF THE DRAWINGS

The accompanying drawings, which provide a further understanding of the present disclosure and constitute a part of the specification, are used in conjunction with the following specific embodiments to explain the present disclosure, but are not intended to limit the present disclosure. In the drawings.

DETAILED DESCRIPTION

Exemplary embodiments of the present disclosure will be described in detail below with reference to the accompanying drawings. It is to be understood that the embodiments described herein are merely for describing and explaining the present disclosure rather than limiting the present disclosure.

Typically, a source and a drain may be formed over an active layer through wet etching. For an oxide thin film transistor, in order to prevent a channel in the active layer from being corroded by an etchant, it is necessary to form an etch barrier layer on the channel.

Figure 1:
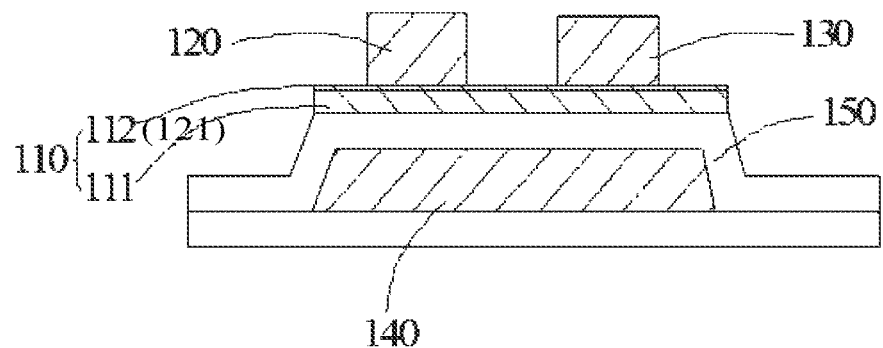
FIG. 1 is a schematic diagram showing a thin film transistor according to an embodiment of the present disclosure.
Figure 2:
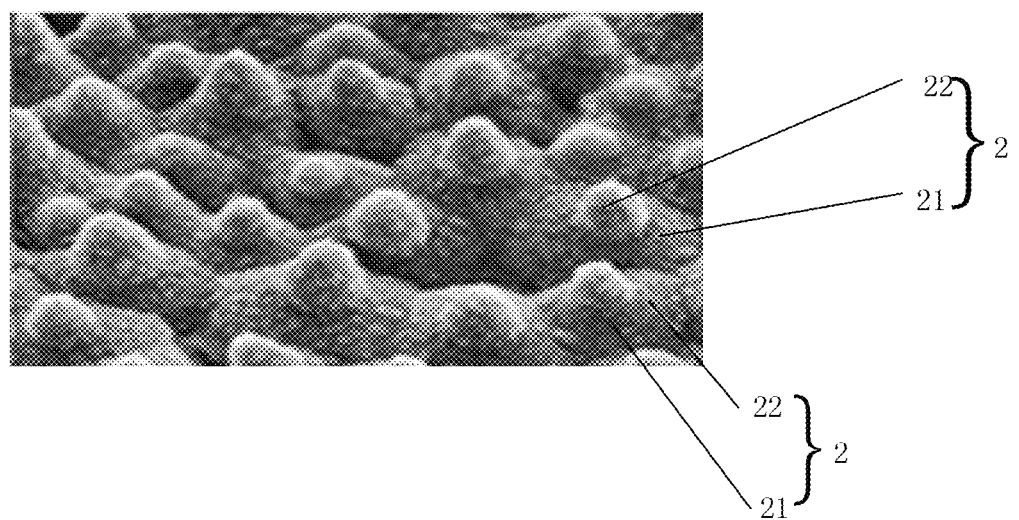
FIG. 2 is a scan image of a surface of a superhydrophobic layer.

FIG. 1 is a schematic diagram showing a thin film transistor according to an embodiment of the present disclosure. As shown in FIG. 1, the thin film transistor includes a semiconductor layer 110, a source 120, and a drain 130. The semiconductor layer includes an active layer 111 and a superhydrophobic layer 112. The active layer 111 includes a source contact, a drain contact, and a channel portion. The source 120 corresponds to the source contact, and the drain 130 corresponds to the drain contact. The superhydrophobic layer 112 is formed on a surface of the active layer 111 proximal to the source 120 and the drain 130 (i.e., an upper surface of the active layer 111 in FIG. 1). The superhydrophobic layer 112 includes multi-level nanostructures protruding from the active layer 111 (as shown in FIG. 2), and the superhydrophobic layer 112 at least covers the channel portion of the active layer 111.

It should be noted that "the source 120 corresponds to the source contact" means that when a gate of the thin film transistor receives a turn-on voltage, a conductive connection is formed between the source 120 and the source contact, and "the drain 130 corresponds to the drain contact" means that when the gate of the thin film transistor receives the turn-on voltage, a conductive connection is formed between the drain 130 and the drain contact. Further, when the gate of the thin film transistor receives the turn-on voltage, the source and the drain are electrically connected to each other, and thus a conductive channel is formed in the active layer 111.

For example, in an embodiment, "the source 120 corresponds to the source contact" may mean that the source 120 is in direct contact with the source contact, or other semiconductor material may be disposed between the source 120 and the source contact. Similarly, "the drain 130 corresponds to the drain contact" may mean that the drain electrode 130 is in direct contact with the drain contact, or other semiconductor material may be disposed between the drain electrode 130 and the drain contact.

In the present disclosure, the superhydrophobic layer is at least provided on the channel portion of the active layer. In manufacturing the thin film transistor according to the present disclosure, a conductive material layer is formed after the superhydrophobic layer 112 is formed. A mask pattern is then formed on the conductive material layer, and the conductive material layer is etched using a wet etching process. After a part of material of the conductive material layer is etched to form an interval between the source and the drain, an etchant is in contact with the superhydrophobic layer. Since a surface of the superhydrophobic layer has the multi-level nanostructures, the etchant does not retain on the surface of the superhydrophobic layer, and thus does not cause damage to the channel portion of the active layer.

The etch barrier layer in the related art is made of a material that does not react with the etchant. In contrast, the superhydrophobic layer according to the present disclosure is free from the damage caused by the etchant due to the physical structures (i.e., the multi-level nanostructures) of the superhydrophobic layer. It can be seen that the thin film transistor according to the present disclosure provides users with more choices and enriches the market.

As shown in FIG. 2, each of the multi-level nanostructures 2 includes a main protrusion 21 having a size of the order of nanometers and at least one sub-protrusion 22 formed on the main protrusion 21 and having a size of the order of nanometer. A distance between tops of two adjacent multi-level nanostructures (i.e., a distance between two adjacent main protrusions 21) may be of the order of nanometers, such as 3 nm to 100 nm. Since the multi-level nanostructures include the protrusion structures arranged regularly as described above, it is possible to prevent adhesion of a liquid (e.g., an etchant) on the active layer. In addition, the source and drain are made of a material having a size of the order of an atom, and the atom has a diameter of about 1/10 nm. Therefore, the superhydrophobic layer does not affect the formation of the source and the drain, and the source and the drain can be stably formed in gaps between the main protrusions 21 and the sub-protrusions 22 of the superhydrophobic layer, respectively.

Further, the term "protrusion" herein means that the microstructure of the superhydrophobic layer has a non-flat surface.

It is to be noted that the active layer 111 is made of a semiconductor material. In the present disclosure, the superhydrophobic layer is not particularly limited to being at a specific position and being made of a specific material, as long as the superhydrophobic layer 112 is provided on the channel portion of the active layer.

For example, the superhydrophobic layer 112 may cover an entire surface of the active layer 111. The superhydrophobic layer 112 may be only located on the channel portion. The superhydrophobic layer 112 and the active layer 111 may be made of the same semiconductor material. Since the superhydrophobic layer 112 and the active layer 111 can be made of the same semiconductor material, the superhydrophobic layer 112 and the active layer 111 can be obtained by a same patterning process, and detailed description thereof is not provided here, but will be provided below.

In the present disclosure, the active layer is not particularly limited to being made of a specific material. For example, the thin film transistor according to the present disclosure is particularly suitable for an oxide thin film transistor in which the active layer is made of a metal oxide. Generally, the active layer may include a material of indium gallium zinc oxide (IGZO). When manufacturing an oxide thin film transistor, the superhydrophobic layer can be served as an etch barrier layer.

In the present disclosure, the thin film transistor is also not particularly limited to having a specific structure. For example, the thin film transistor may be a bottom-gate type thin film transistor. As shown in FIG. 1, the thin film transistor may further include a gate 140 and a gate insulating layer 150. The gate insulating layer 150 is provided between the gate 140 and the active layer 111, such that the gate 140 and the active layer 111 are spaced apart from each other in a thickness direction of the thin film transistor.

As described above, in the present disclosure, the superhydrophobic layer 112 is also not particularly limited to being made of a special material, as long as an arrangement of the superhydrophobic layer 112 does not affect the function of the active layer 110. In an embodiment, the superhydrophobic layer 112 is made of the same material as the material of the active layer 111. The superhydrophobic layer 112 covers or overlaps with the active layer 111, and an edge of the superhydrophobic layer 112 is aligned with an edge of the active layer 111. In this embodiment, the superhydrophobic layer and the active layer can be formed by a same process in a same process chamber, thereby saving one step of the patterning process.

In this embodiment, a portion of the superhydrophobic layer is disposed between the source 120 and the source contact, and another portion of the superhydrophobic layer is disposed between the drain 130 and the drain contact. The source/drain are in contact with the multi-level nanostructures of the superhydrophobic layer, thereby increasing a contact area, reducing a contact resistance, and enhancing an ohmic contact between the source 120 and the source contact and an ohmic contact between the drain and drain contact.

In an embodiment, a portion of the superhydrophobic layer in contact with the source may be provided as an ohmic contact portion of the source, and a portion of the superhydrophobic layer in contact with the drain may be provided as an ohmic contact portion of the drain, thereby achieving the ohmic contacts between the electrodes and the semiconductor layer with the above drain contact and the source contact omitted. Since the preparation of the drain contact and the source contact may be omitted, the manufacturing process is simplified.

As another aspect of the present disclosure, an array substrate including a plurality of thin film transistors is provided, and at least one of the plurality of thin film transistors is the above-described thin film transistor provided by the present disclosure.

In the present disclosure, the superhydrophobic layer instead of the etch barrier layer is disposed on the active layer of the thin film transistor, thereby providing a user with more choices.

Moreover, in the embodiment of the present disclosure, since the active layer and the superhydrophobic layer are manufactured integrally using the same material, the additional formation of a superhydrophobic layer is not required, thereby saving one step of patterning process, and reducing the cost thereof.

In an embodiment, the superhydrophobic layer 112 and the active layer 111 may be made of different semiconductor materials, respectively. That is, the superhydrophobic layer 112 and the active layer 111 may be two layers that are made of different materials. For example, the active layer 111 may contain indium gallium zinc oxide, and the superhydrophobic layer 112 may contain low temperature polysilicon or the like.

As a third aspect of the present disclosure, a display panel including the above array substrate according to the present disclosure is provided.

The advantages and principles of the array substrate have been described in detail above, and the details thereof are omitted here.

Figure 3:
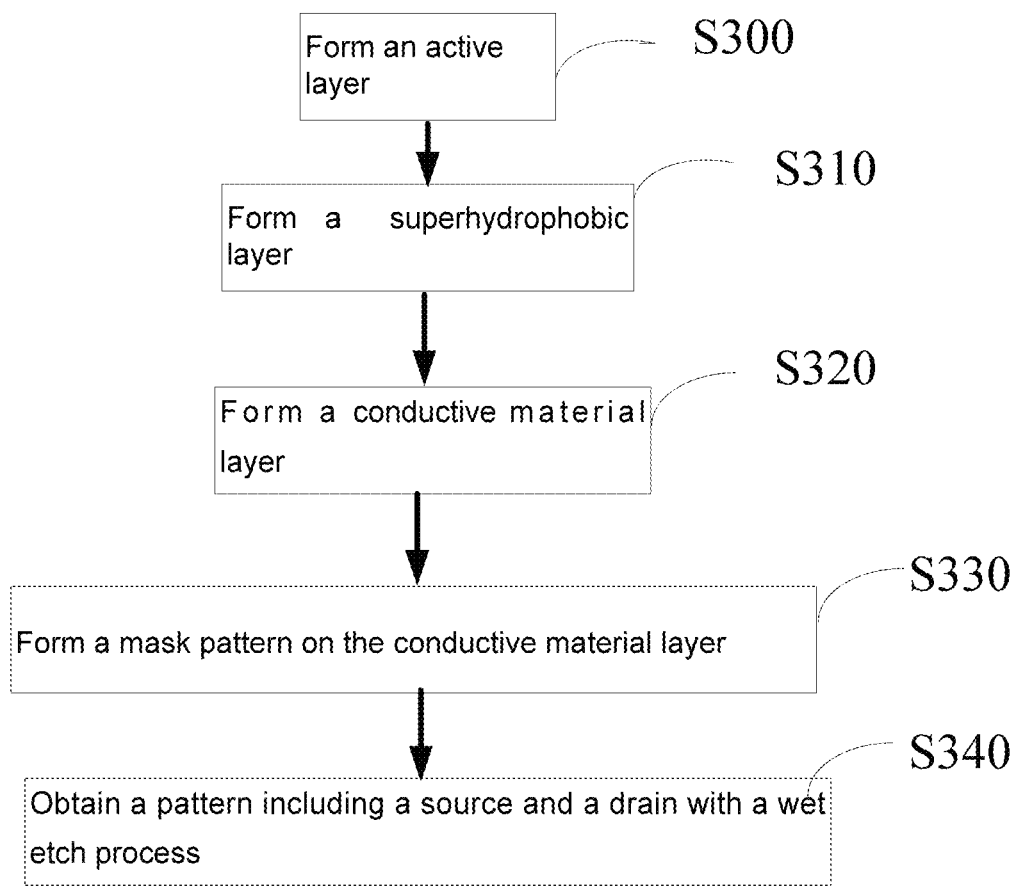
FIG. 3 is a schematic flowchart showing a method for manufacturing a thin film transistor according to an embodiment of the present disclosure.

FIG. 3 is a schematic flowchart showing a method for manufacturing a thin film transistor according to an embodiment of the present disclosure. The array substrate includes a plurality of thin film transistors, each of which includes a semiconductor layer, a source and a drain. As shown in FIG. 3, the manufacturing method includes steps 300 to S340.

At step S300, the active layer 111 is formed.

At step S310, the superhydrophobic layer 112 is formed on the active layer 111.

At step S320, a conductive material layer, which covers and is attached to the superhydrophobic layer 112, is formed.

At step S330, a mask pattern is formed on the conductive material layer.

At step S340, the conductive material layer is etched by performing a wet etching process with the mask pattern as an etch mask to obtain a pattern including a source and a drain, such that at least a portion of the source corresponds to the source contact, and at least a portion of the drain corresponds to the drain contact.

The superhydrophobic layer 112 is disposed on a surface of the active layer 111 proximal to the source 120 and the drain 130. The superhydrophobic layer 112 includes the multi-level nanostructures protruding from the surface of the active layer. The superhydrophobic layer 112 covers the channel portion of the active layer 111.

As described above, the semiconductor layer may include a material such as a metal oxide. For example, the semiconductor layer includes indium gallium zinc oxide.

Specifically, step S340 may include supplying an etchant onto the conductive material layer with the mask pattern formed thereon. The conductive material layer is etched by the etchant until the superhydrophobic layer is exposed, so as to obtain the pattern including the source and the drain.

In any one of the thin film transistors, the superhydrophobic layer at least covers the channel portion of the active layer of the thin film transistor.

Since the superhydrophobic layer is disposed at a position of the channel portion, the etchant does not retain on the superhydrophobic layer when the conductive material is wet-etched in step S340, thereby preventing the active layer from being damaged.

In the present disclosure, the etchant may be supplied to the conductive material layer on which the mask pattern is formed by immersing the conductive material layer in the etchant. Alternatively, the etchant may be supplied to the conductive material layer (i.e., a metal layer) on which the mask pattern is formed by spraying the etchant over the conductive material layer.

In the present disclosure, the mask pattern may be made of a photoresist material. The mask pattern can be obtained by exposure and development of the photoresist material. Alternatively, the mask pattern can also be disposed on the conductive material layer by transfer printing.

The source/drain are in contact with the multi-level nanostructures of the superhydrophobic layer, thereby increasing a contact area, reducing a contact resistance, and enhancing an ohmic contact between the source 120 and the source contact and an ohmic contact between the drain and drain contact.

In an embodiment, a portion of the superhydrophobic layer in contact with the source may be provided as an ohmic contact portion of the source, and a portion of the superhydrophobic layer in contact with the drain may be provided as an ohmic contact portion of the drain, thereby achieving the ohmic contacts between the electrodes and the semiconductor layer with the above drain contact and the source contact omitted. Since the preparation of the drain contact and the source contact may be omitted, the manufacturing process is simplified.

Figure 4:
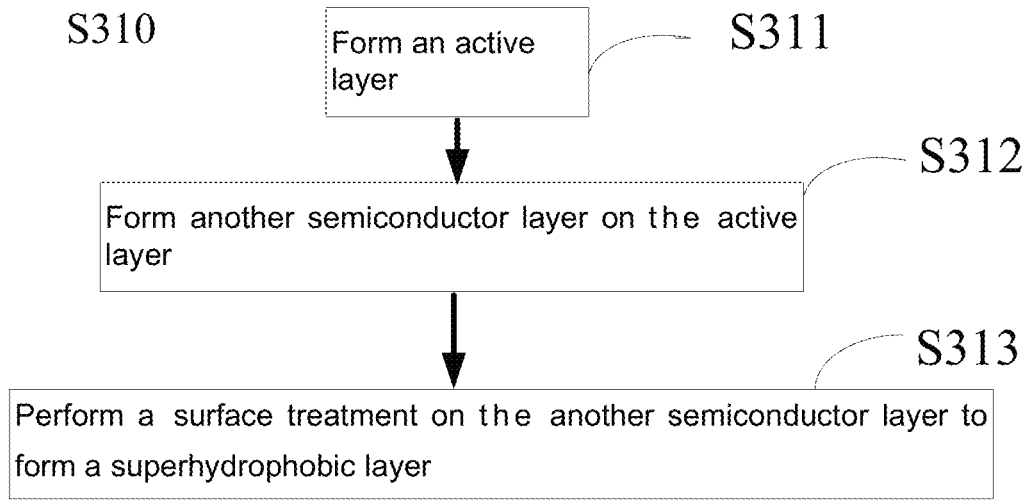
FIG. 4 is a schematic flowchart showing steps of forming a superhydrophobic layer according to an embodiment of the present disclosure.

FIG. 4 is a schematic flowchart showing steps for forming a superhydrophobic structure according to an embodiment of the present disclosure. As shown in FIG. 4, in a case that the active layer 111 and the superhydrophobic layer 112 are formed of different semiconductor materials, the step S310 of forming the superhydrophobic layer may include step S311, step S312, and step S313.

At step S311, the active layer 111 is formed.

At step S312, another semiconductor layer 121 is formed on the active layer 111.

At step S313, a nanoimprinting process, an anodized aluminum transfer process, a plasma etching process, or a pulse laser process is performed on the another semiconductor layer 121, so as to form the superhydrophobic layer 112.

The active layer 111 and the superhydrophobic layer 112 may be formed of different semiconductor materials. For example, the active layer 111 may contain indium gallium zinc oxide, and the superhydrophobic layer 112 may contain low temperature polysilicon or the like.

Figure 5:
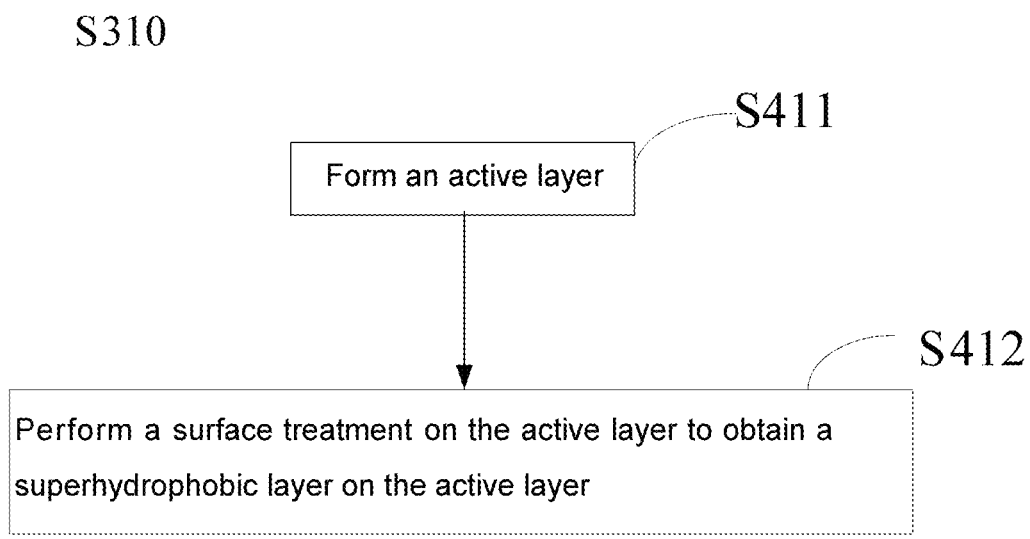
FIG. 5 is a schematic flowchart showing steps of forming a superhydrophobic layer according to an embodiment of the present disclosure.

FIG. 5 is a schematic flowchart showing steps for forming a superhydrophobic layer according to an embodiment of the present disclosure. In order to reduce an amount of material and simplify steps, the active layer 111 and the superhydrophobic layer 112 may also be made of a same semiconductor material. In this case, as shown in FIG. 5, the step S310 of forming the superhydrophobic layer may include step S411 and step S412.

At step S411, the active layer 111 is formed.

At step S412, a surface treatment is performed on the active layer 111 (i.e., the semiconductor layer) to obtain the superhydrophobic layer 112 on the active layer 111. For example, a nanoimprinting process, an anodized aluminum transfer process, a plasma etching process, or a pulse laser process is performed on the active layer 111 (i.e., the semiconductor layer) to obtain the superhydrophobic layer 112 on the active layer 111.

In the present disclosure, the manners for performing the above surface treatment steps are not particularly limited. In an embodiment, the steps of surface treatment on the semiconductor layer include the following.

Introducing a process gas into a process chamber in which the active layer 111 (i.e., the semiconductor layer) is deposited, and performing a plasma etching process on a surface of the active layer 111 in the process chamber. The process gas includes oxygen and/or fluorinated carbon, and a power of the process chamber is in a range of 2500 W to 3500 W. A duration of the plasma etching process is in a range of 180 s to 300 s.

In other words, after the semiconductor layer is deposited, the process gas is introduced sequentially into the process chamber to perform the plasma etching process on the semiconductor layer, without removing the semiconductor layer out of the process chamber, thereby simplifying the manufacturing process. In addition, the plasma particles generated in the process can sequentially form the superhydrophobic layer on the surface of the active layer, thereby thinning the film layer and reducing the cost.

As another embodiment of the present disclosure, the steps for performing surface treatment on the semiconductor layer include the following.

Performing a surface treatment on the active layer 111 (i.e., the semiconductor layer) using a pulse laser process, and a duration of the pulse laser process is in a range of 180 s to 300 s.

For example, the surface treatment can be performed on the semiconductor layer with pulse laser (or laser pulses) generated by a $CO_2$ laser.

FIG. 1 shows a bottom-gate type thin film transistor, and accordingly before the step of forming the semiconductor layer (e.g., the active layer 111), the method for manufacturing the thin film transistor may further include the following steps:

forming a pattern including a gate; and forming a gate insulating layer.

It should be understood that the above embodiments are merely exemplary embodiments for the purpose of illustrating the principles of the present disclosure, however, the present disclosure is not limited thereto. It will be apparent to those skilled in the art that various changes and modifications can be made without departing from the essence and spirit of the present disclosure, which are also to be regarded as falling within the scope of the present disclosure.

What is claimed is:

1. A thin film transistor comprising:
   an active layer;
   a superhydrophobic layer on the active layer; and
   a source and a drain on the active layer,
   wherein the superhydrophobic layer is disposed on a surface of the active layer proximal to the source and the drain,
   the superhydrophobic layer comprises a plurality of multi-level nanostructures protruding from the surface of the active layer, and
   the superhydrophobic layer covers at least a channel portion of the active layer.

2. The thin film transistor according to claim 1, wherein the superhydrophobic layer covers the entire surface of the active layer,
   a first portion of the superhydrophobic layer in contact with the source serves as an ohmic contact portion of the source,
   a second portion of the superhydrophobic layer in contact with the drain serves as an ohmic contact portion of the drain, and
   a third portion of the superhydrophobic layer that is not in contact with the source and the drain serves as an etch barrier layer.

3. The thin film transistor according to claim 2, wherein the active layer further comprises a source contact and a drain contact,
the first portion of the superhydrophobic layer is between the source contact and the source, and
the second portion of the superhydrophobic layer is between the drain contact and the drain.

4. The thin film transistor according to claim 2, wherein the superhydrophobic layer has the same material as that of the active layer, and
the superhydrophobic layer has an edge aligned with an edge of the active layer.

5. The thin film transistor according to claim 2, wherein the superhydrophobic layer has a material different from that of the active layer, and
the superhydrophobic layer has an edge aligned with an edge of the active layer.

6. The thin film transistor according to claim 1, wherein each of the plurality of multi-level nanostructures comprises a main protrusion having a size of an order of nanometers, and at least one sub-protrusion formed on the main protrusion and having a size of an order of nanometer, and
a distance between two adjacent main protrusions is in a range of 3 nm to 100 nm.

7. The thin film transistor according to claim 1, wherein the active layer has a material of metal oxide.

8. The thin film transistor according to claim 7, wherein the active layer has a material of indium gallium zinc oxide.

9. An array substrate, comprising the thin film transistor according to claim 1.

10. A display panel, comprising the array substrate according to claim 9.

11. A method for manufacturing a thin film transistor, comprising:
forming an active layer;
forming a superhydrophobic layer on the active layer;
forming a conductive layer covering the superhydrophobic layer;
forming a mask pattern on the conductive layer;
etching the conductive layer by performing a wet etching process with the mask pattern as an etch mask to obtain a pattern comprising a source and a drain, wherein
the superhydrophobic layer is disposed on a surface of the active layer proximal to the source and the drain,
the superhydrophobic layer comprises a plurality of multi-level nanostructures protruding from the surface of the active layer, and
the superhydrophobic layer is disposed to cover at least a channel portion of the active layer.

12. The method according to claim 11, wherein
the superhydrophobic layer is formed on the entire surface of the active layer,
a first portion of the superhydrophobic layer in contact with the source is formed as an ohmic contact portion of the source,
a second portion of the superhydrophobic layer in contact with the drain is formed as an ohmic contact portion of the drain, and
a third portion of the superhydrophobic layer that is not in contact with the source and the drain is formed as an etch barrier layer.

13. The method according to claim 12, further comprising:
forming a source contact in the active layer below the first portion of the superhydrophobic layer, and
forming a drain contact in the active layer below the second portion of the superhydrophobic layer.

14. The method according to claim 11, wherein the forming a superhydrophobic layer on the active layer comprises:
performing a surface treatment on the active layer by a nanoimprinting process, an anodized aluminum transfer process, a plasma etching process, or a pulse laser process to obtain the superhydrophobic layer.

15. The method according to claim 14, wherein the performing a surface treatment on the active layer comprises:
introducing a process gas into a process chamber in which the active layer is deposited, and performing a plasma etching process on the active layer in the process chamber,
wherein the process gas comprises oxygen and/or fluorinated carbon, and
a power of the process chamber is in a range of 2500 W to 3500 W, and a duration of the plasma etching process is in a range of 180 s to 300 s.

16. The method according to claim 14, wherein the performing a surface treatment on the active layer comprises:
performing the surface treatment on the active layer using pulse laser with a duration of 180 s to 300 s.

17. The method according to claim 11, wherein the forming a superhydrophobic layer on the active layer comprises:
forming an active layer;
forming a semiconductor layer on the active layer;
performing a surface treatment on the semiconductor layer by a nanoimprinting process, an anodized aluminum transfer process, a plasma etching process, or a pulse laser process to obtain the superhydrophobic layer, wherein
the active layer is made of a different material from that of the semiconductor layer.

18. The method according to claim 17, wherein the performing a surface treatment on the active layer comprises:
introducing a process gas into a process chamber in which the active layer is deposited, and performing a plasma etching process on the active layer in the process chamber,
wherein the process gas comprises oxygen and/or fluorinated carbon, and
a power of the process chamber is in a range of 2500 W to 3500 W, and a duration of the plasma etching process is in a range of 180 s to 300 s.

19. The method according to claim 17, wherein the performing a surface treatment on the active layer comprises:
performing the surface treatment on the active layer using pulse laser with a duration of 180 s to 300 s.

20. The method according to claim 11, wherein the etching the conductive layer by performing a wet etching process with the mask pattern as an etch mask to obtain a pattern comprising a source and a drain comprises:
supplying an etchant to the conductive layer by submerging, into the etchant, the conductive layer on which the mask pattern is formed; or
supplying an etchant to the conductive layer by spraying the etchant over the conductive layer.

* * * * *